United States Patent [19]

Iadarola et al.

[11] Patent Number: 4,543,715
[45] Date of Patent: Oct. 1, 1985

[54] METHOD OF FORMING VERTICAL TRACES ON PRINTED CIRCUIT BOARD

[75] Inventors: Ralph E. Iadarola, Roseland; Warren F. Strassle, Wayne; Gene W. Russo, No. Haledon, all of N.J.

[73] Assignee: Allied Corporation, Morris Township, Morris County, N.J.

[21] Appl. No.: 470,885

[22] Filed: Feb. 28, 1983

[51] Int. Cl.[4] .............................................. H01K 3/10
[52] U.S. Cl. .................................... 29/852; 174/68.5; 427/97
[58] Field of Search ................. 29/852, 830; 174/68.5; 427/97; 83/41

[56] References Cited

U.S. PATENT DOCUMENTS

| | | | |
|---|---|---|---|
| 3,742,597 | 7/1973 | Davis | 427/97 X |
| 3,760,091 | 9/1973 | Cannizzaro et al. | 174/68.5 |
| 3,930,963 | 1/1976 | Polichette et al. | 427/97 X |
| 4,104,111 | 8/1978 | Mack | 427/97 X |
| 4,372,046 | 2/1983 | Suzuki | 29/852 |

OTHER PUBLICATIONS

IBM Tech. Discl. Bulletin, vol. 10, No. 12, May 1968, pp. 1985, 1986, Making Interconnections in Multilayer Boards.

*Primary Examiner*—Howard N. Goldberg
*Assistant Examiner*—Carl J. Arbes
*Attorney, Agent, or Firm*—Stanley N. Protigal

[57] ABSTRACT

A multilayer printed circuit board (10) is provided with vertical circuit traces (51–54) which are readily accessible by mechanical means, by first creating vias at the locations of the vertical circuit traces (51–54). An opening (59) is then bored in a manner that the perimeter of the opening (59) intercepts the vias. The remaining plating material on the vias forms the vertical circuit traces (51–54), which are thereby established along the perimeter of the opening (59).

This technique utilizes procedures which are readily adaptable to present multilayer printed circuit board manufacturing techniques and which effect a low cost and reliable connection. Furthermore, the vertical circuit traces (51–54) are readily accessible for mechanical broaching and can be formed in a relatively high-density configuration.

14 Claims, 2 Drawing Figures

METHOD OF FORMING VERTICAL TRACES ON PRINTED CIRCUIT BOARD

BACKGROUND OF THE INVENTION

This invention relates to the manufacture of multilayer printed circuit boards and, more specifically, to a method for forming interconnections between layers of such printed circuit boards.

Prior art multilayer printed circuit (P.C.) boards have used via holes drilled in order to interconnect circuitry between the plural layers. On state-of-the-art boards, the vias are typically 1 mm (0.04") diameter or less. These vias are individually plated through and connections are effected by causing (horizontal) circuit traces on the different layers to reach the vias. If such boards were to be modified by selectively connecting different layers in accordance with the specific modification, then circuit traces on ers intermediate the connection had to be removed either in fabrication or by broaching. Due to the small diameter of the via holes, such broaching was difficult and was liable to cause circuit continuity defects.

It is frequently desired to effect a series of connections between layers wherein access to the connections is readily available. This requires that a large vertical hole, having a cross-sectional area greater than that of a typical via, be created and vertical connections formed to extend along the perimeter of the hole. In essence, such a hole would be an oversized via hole having plural vertical circuit traces extending along the perimeter of the hole. These circuit traces could be selectively broached with relative ease because the size of each trace is relatively small compared to the size of the hole. Furthermore, connections with or between the vertical traces can be readily made by the insertion of a rod or similar device, having circuit traces thereon, into the hole.

It is desirable to form vertical circuit traces within a small horizontal area such that the vertical circuit traces are relatively easily accessible by mechanical means. By providing for mechanical accessibility, connections can be broken to selectively leave traces connected at plural layers of a multilayer circuit board after plating operations have been completed by merely broaching a plated connection from the external surface of a vertical opening. It is further desired to be able to form a vertical opening to be significantly larger than the size of vertical traces extending along the perimeter of the hole.

SUMMMARY OF THE INVENTION

In accordance with the present invention, a method is provided whereby a plurality of vertical circuit traces at an opening of a printed circuit board are established by first drilling and plating a number of holes at the desired location of the traces with a drill size equivalent to a desired trace width. The board, including the drilled holes is then panel plated to an electrical current carrying capacity required by the circuit design of the via traces. An opening intersecting the via traces is cut out, leaving the plated vias exposed and available for further processing.

DETAILED DESCRIPTION OF THE PREFERRED EMBODIMENT

Figure 1:
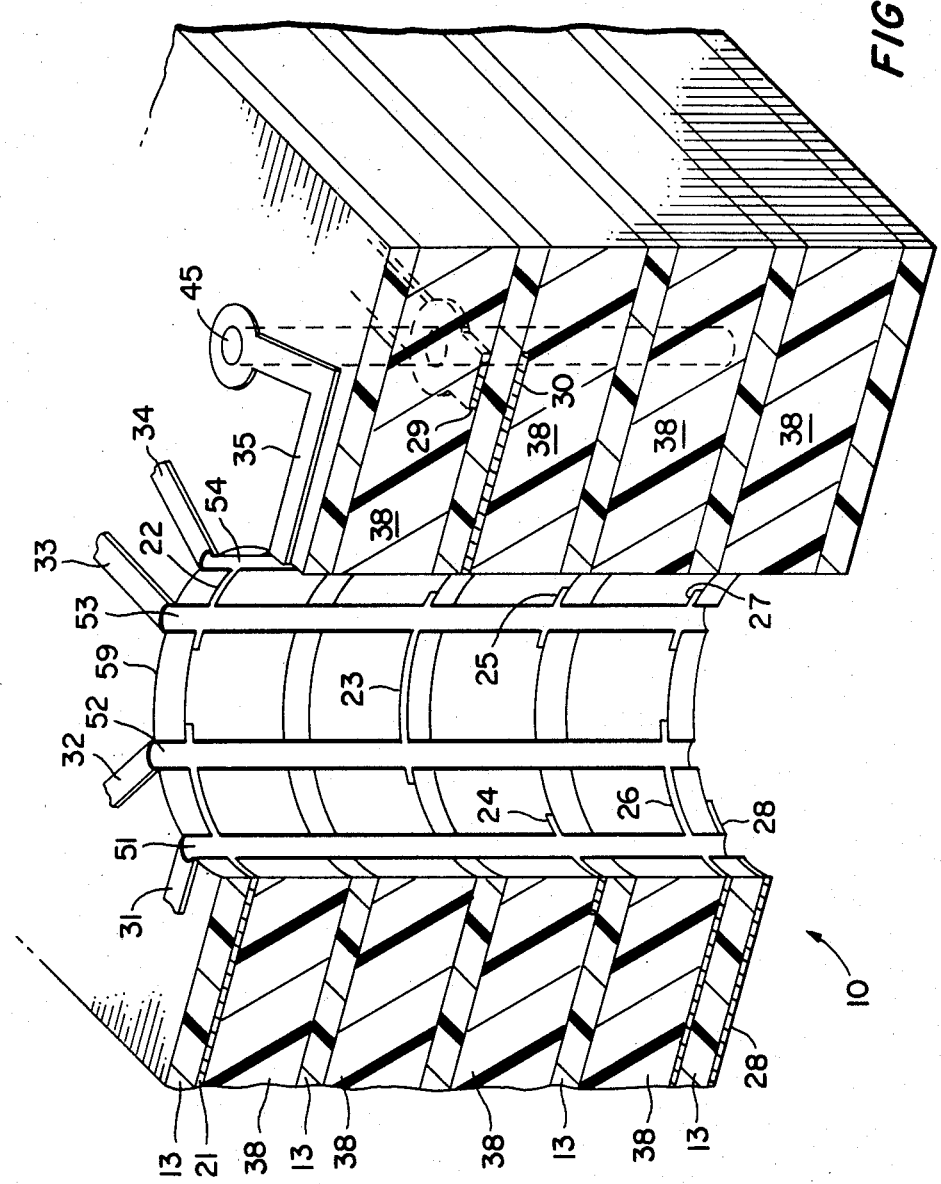
FIG. 1 is an elevated isometric cross-sectional view of a multilayer printed circuit board having vertical traces formed in accordance with the preferred embodiment of the invention.

Referring to FIG. 1, a multilayer printed circuit board 10 typically has plural layers of insulative sheets of core material forming core plates 13, which are clad with a conductive material such as copper, using an electroless plating technique. The cladding is then photoetched, leaving circuit traces such as circuit traces 21-35. Circuit traces 21-35 are considered to be horizontal traces and as a result of their being formed by photoetching of cladded material, are located either immediately above or immediately below the core plates 13. Each side of the core plates 13 is considered to be a separate printed circuit board layer because of the arrangement of horizontal circuit traces 21-35 at the location of those layers. The core plates 13 are bound together with a prepreg layer 43 (sometimes called B stage), made of an insulative binder material such as epoxy. The prepreg 43 serves to separate the core plates 13 and, more importantly, the horizontal circuit traces 21-35 on the adjacent core plates 13. Thus, the prepreg 43 and the core plates 13 form insulator layers 13, 43 for the multilayer printed circuit board 10.

The circuit board 10 is considered to be a ten-layer printed circuit board because it has ten layers of horizontal circuit traces 21-35. Connections to and between the horizontal circuit traces 21-35 at different horizontal levels can be effected by use of vias holes such as via 45 by drilling and plating via holes in a manner well known to those skilled in the art. The via 45 extends vertically through the insulator layers 13, 43 and may pass one or more circuit traces, such as circuit traces 29 and 35. Vias, such as via 45 can be used to effect connections between circuit traces, such as traces 29 and 35 in different layers. For example, circuit trace 29 is in the third layer and is connected to circuit trace 35, located in the first or top layer. The vias such as via 45 can also be used for external connections to the layers, particularly layers below the top layer (the top layer having circuit traces 21-35). Vias are usually connected to the ciruit traces 21-35 by their passing through to different circuit traces. In some cases, it is possible to drill a via hole to a particular depth (not shown) in order to establish a via to a pre-determined level. Other attempts have been made to selectively connect layers by broaching the circuit traces 21-35. This becomes fairly difficult in the case of circuit traces which are located in intermediate layers, such as circuit traces 21-27 and 29.

In order to provide connections between plural layers which are externally accessible, vertical circuit traces such as traces 51-54 are established along an opening 59 in the P.C. board. These vertical traces 51-54 are accessible and can be selectively broached as necessary in order to break the connections between the layers. For example, it may be desired to modify a particular model board so that circuit trace 21 is connected to circuit trace 31, but not to circuit trace 24, leaving circuit trace 33, 23, 26 and 24 interconnected. It is possible to broach selected vertical circuit traces 51-54 from the opening 59 in order to effect these modifications. Specifically, the broaching could be to circuit trace 51 between circuit traces 21 and 24, and to broach circuit trace 52 between circuit traces 21 and 23. While other circuit traces (such as circuit traces 25 and 27) would be connected to these circuits, the separation between circuit traces 21 and 24 would be effected.

Figure 2:
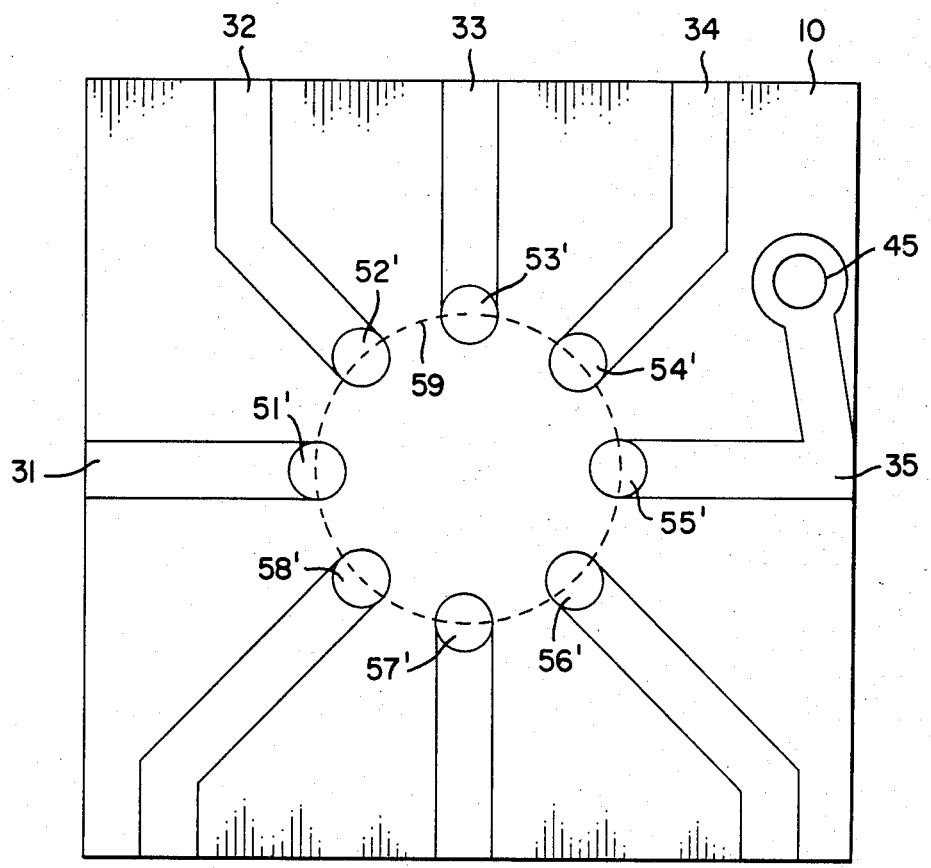
FIG. 2 is a top plan view showing the layout used for establishing vertical circuit traces on the P.C. board of FIG. 1.

Referring to FIG. 2, the vertical circuit traces, such as traces 51-54 are prepared from via holes 51'-54', which are drilled in the P.C. board 10 along a bolt circle pattern. Additional via holes 55'-58' are also drilled, thus completing the bolt circle pattern so that the pattern will have eight holes. The opening 59 is defined by the bolt circle pattern, that is by a circle intersecting the centers of the vias 51-58 drilled in the bolt circle pattern. At this point, the opening 59 is not yet created. The via holes 51'-58' are at this point plated through so that the portion of the plated through holes, remaining outside of what will be the opening 59, will have a current carrying capacity required by the circuit design. In the preferred embodiment, the plating is effected by electroless plating with copper.

In the preferred embodiment, the external plated portions of the circuit board 10, including the via holes 45 and 51'-58' are then lead-tin plated. In alternate embodiments, however, the lead-tin plating step can be postponed until later as will be described infra. The lead-tin plating is preferrably accomplished by fusion soldering techniques such as wave soldering. Alternatively, the lead-tin plating may be applied by electroless plating techniques.

After the vias are established at via holes 51'-58', the opening 59 is established by drilling an appropriate sized hole through the center of the aforementioned bolt pattern established by vias 51'-58'. Since the opening 59 intersects the vias 51'-58', the step of drilling the opening 59 removes approximately half of the material from the vias 51'-58', thereby leaving corresponding vertical circuit traces, such as circuit traces 51-54 shown in FIG. 1.

The vertical circuit traces 51-54 shown in FIG. 1 and the vertical circuit traces (not shown) which are obtained from vias 51'-58' can be left as formed or mechanically broached as desired. It is also possible to insert a circuit element such as a switch (not shown) into the opening 59 in such a way that the circuit element contacts the vertical circuit traces such as circuit traces 51-54.

If, as in the alternate embodiment, the lead-tin plating process has not been performed prior to drilling the opening 59, the opening 59 may now be lead-tin plated. Such lead-tin plating may be accomplished either before or after selectively broaching the vertical circuit traces 51-54. The circuit board 10 is now etched and the steps necessary to complete processing of ordinary multilayer printed circuit boards is completed.

It is possible to modify the specific embodiment shown. For example, it is not necessary to employ a symmetric 8-hole bolt circle pattern for establishing the vertical circuit traces as shown. It is possible to employ this technique with as few as one vertical circuit trace (although a bolt circle would not be thusly established). It is also possible to establish the opening along geometric dimensions which are different from opening 59. These and other embodiments being possible, it is desired to limit the described method only as defined by the claims.

What is claimed is:

1. Method for forming vertical conductive traces on a multilayer printed circuit board having at least one internal layer characterized by:

forming a plurality of via holes; and
establishing conductive plating paths along the via holes;
boring an opening along said pattern having walls substantially parallel to the via holes, thereby leaving the vertical traces,
wherein the step of establishing conductive plating paths along the via holes includes electroless plating of the via holes prior to boring the opening.

2. Method as claimed in claim 1, further characterized by:
the pattern being a circular bolt pattern and the opening having a circular cross-section except at the via holes.

3. Method as claimed in claim 1 further characterized by:
applying a second plating layer to the conductive paths.

4. Method as claimed in claim 3 further characterized by:
applying the second plating layer after the opening is bored.

5. Method as claimed in claim 3 further characterized by:
the additional plating material being a lead-tin alloy.

6. Method as claimed in claim 3 further characterized by:
the additional coating material being applied by contact with a molten form of the additional coating material.

7. Method as claimed in claim 4 further characterized by:
the additional coating material being applied by contact with a molten form of the additional coating material.

8. Method for forming vertical conductive traces on a multilayer printed circuit board having at least one internal layer characterized by:
drilling a plurality of via holes;
plating conductive paths along the via holes; and
boring an opening having holes substantially parallel to the via holes, so that the opening intercepts the via holes, thereby leaving the vertical traces,
wherein the step of plating along the via holes includes electroless plating of the via holes prior to boring the opening.

9. Method as claimed in claim 8, further characterized by:
said plurality of via holes being drilled in a circular bolt pattern, and the opening having a circular cross-section except at the via holes.

10. Method as claimed in claim 8, further characterized by:
applying a second plating layer to the conductive paths.

11. Method as claimed in claim 10 further characterized by:
applying the second plating layer after the opening is bored, the additional plating material being a lead-tin alloy.

12. Method for forming vertical conductive traces a multilayer on printed circuit board having at least one internal layer characterized by:
drilling a plurality of via holes,
plating conductive paths along the via holes;
after plating the conductive paths, boring an opening having holes substantially parallel to the via holes, so that the opening intercepts the via holes, thereby leaving the vertical traces; and applying a second plating layer to the conductive paths.

13. Method as claimed in claim 12, further characterized by:

said plurality of via holes being drilled in a circular bolt pattern, and the opening having a circular cross-section except at the via holes.

14. Method as claimed in claim 12 further characterized by:

applying the second plating layer after the opening is bored, the additional plating material being a lead-tin alloy.

* * * * *